United States Patent [19]
England et al.

[11] Patent Number: 6,060,715
[45] Date of Patent: May 9, 2000

[54] METHOD AND APPARATUS FOR ION BEAM SCANNING IN AN ION IMPLANTER

[75] Inventors: Jonathan Gerald England, West Sussex; Andrew Holmes, Oxfordshire, both of United Kingdom

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/962,257

[22] Filed: Oct. 31, 1997

[51] Int. Cl.[7] .......................... H01J 37/317; H01J 37/147
[52] U.S. Cl. .................................. 250/492.21; 250/396 R
[58] Field of Search ........................... 250/492.21, 396 R

[56] References Cited

U.S. PATENT DOCUMENTS

| | | | |
|---|---|---|---|
| 3,689,766 | 9/1972 | Freeman | 250/492.21 |
| 3,795,833 | 3/1974 | King et al. | 313/63 |
| 4,580,058 | 4/1986 | Mears et al. | 250/492.21 |
| 4,914,305 | 4/1990 | Benveniste et al. | 250/492.21 |
| 5,389,793 | 2/1995 | Aitken et al. | 250/492.21 |

FOREIGN PATENT DOCUMENTS

145119A1  6/1985  European Pat. Off. .

OTHER PUBLICATIONS

N. Turner, "Comparison of Beam Scanning Systems," Ion Implantation: Equipment and Techniques, Proceedings of the International Conference, Sep. 13, 1982, pp. 126–142.
L.D. Stewart et al., "Beam focusing by aperture displacement in multiampere ion sources," Review of Scientific Instruments, vol. 46, No. 9, Sep. 1975, pp. 1193–1196.

*Primary Examiner*—Jack Berman
*Attorney, Agent, or Firm*—Boult Wade Tennant

[57] ABSTRACT

An ion implanter for implanting ions in a target substrate is arranged to scan the ion beam at the point of extraction of the beam from the ion source. The ion beam extraction assembly includes a tectrode construction in which an extraction electrode adjacent the ion source aperture is split into two halves. A differential voltage is applied across the two halves of the extraction electrode to deflect the ion beam being extracted from the ion source electrostatically. The plane of deflection is arranged to coincide with the plane if dispersion of the ions in a mass analyser magnet downstream of the extraction point and the deflected beam of ions of desired mass/charge ratio is still brought to focus at a common mass selection slit at the exit of the analyser magnet.

8 Claims, 3 Drawing Sheets

METHOD AND APPARATUS FOR ION BEAM SCANNING IN AN ION IMPLANTER

FIELD OF THE INVENTION

The invention relates to ion beam scanning in, but not limited to, ion implanter systems for implanting ions from an ion beam into target substrates such as semiconductor wafers. More specifically the invention relates to apparatus and method for scanning the ion beam at the point of extraction of the ion beam from an ion source.

BACKGROUND OF THE INVENTION

Ion implantation techniques, e.g. for modifying the electrical conductivity properties of semiconductor materials, are known in the manufacture of integrated circuit structures in semiconductor wafers. Such ion implanters generally comprise an ion beam generator having a source of ions of the element to be implanted in the semiconductor wafer, and an extraction assembly for extracting ions from the source and forming a beam of the extracted ions. The ion beam so produced is then passed through a mass analyser and selector for selecting a particular species of ions in the ion beam for onward transmission for implantation in the wafer or target substrate.

In order to ensure good homogeneity of the dose of implanted ions over the surface of the target substrate being implanted, the substrate and the ion beam are scanned relative to each other so that in one process treatment the dose at any position on the target substrate is made up of components from a large number of individual scans. A common scanning technique used in the prior art involves mechanically moving the target substrate relative to a stationary beam. The target substrate is mechanically scanned in two dimensions. Apparatus of this kind is described for example in U.S. Pat. No. 5,389,793. In such apparatus, a number of target substrates are mounted on a rotatable wheel, whereby rotation of the wheel in the process chamber of the implant tool provides the scan of each of the target substrates mounted on the wheel in one direction, and reciprocating movement of the axis of rotation provides the scanning movement in a second direction.

The physical speed of relative scanning of target substrate and ion beam by mechanical means limits the minimum process time possible with such mechanical scanning implanters, if a certain minimum number of repeat scans is required for each substrate in order to ensure adequate homogeneity of dose over the substrate surface. In prior art machines, a batch of target substrates are processed simultaneously in order to provide adequate throughput for the implant machines.

Because the rotatable wheel of the process chamber is rotated during scanning at a high rate, the wafers are mounted on the wheel on mounting surfaces which are angled relative to the plane of rotation slightly inwards towards the axis of rotation. In this way, the wafers are held firmly against the wafer support surfaces by centrifugal force. The wafers are therefore distributed on the process wheel on a shallow conical surface and are scanned in this conical surface through the beam during processing. As a result, the angle between the beam and the wafer changes slightly as the wafer is scanned through the beam, resulting in a small non-uniformity of the angle of implantation of ions into the wafer.

Also, with a batch processing system as known in the prior art, if there are insufficient wafers available for processing to fill all the available mounting points on the process wheel, unfilled mounting points must be filled with dummy substrates to maintain the balance of the wheel. These dummy substrates are expensive and can cause process problems such as contamination, especially if the same dummy wafer is used repeatedly.

Also, any process failure occurring during a batch run in known batch processors results in all wafers in the batch being scrapped.

The above problems of batch processing ion implanters would be readily resolved by a machine arranged to process wafers singly. Single wafer processing would also fit in better with the single wafer processing tools customarily used in semiconductor fabrication plants for other processing procedures. However, mechanical scanning alone would not give the processing speeds necessary for a single wafer machine to provide adequate output.

Accordingly, single wafer implanters have been proposed in which the fast scanning of the ion beam relative to the wafer in one co-ordinate direction is performed by electrostatic or electromagnetic scanning of the beam, while the slower rate scanning in the orthogonal co-ordinate direction is performed by mechanically moving the wafer.

Although ion beams may be theoretically scanned either electrostatically or electromagnetically, there are well established problems with electrostatic scanning. It is well known to those experienced in this field that difficulties arise in controlling ion beams, especially at relatively lower energies, when the ion beam travels through regions of electric field. These problems arise because electrons cannot exist for substantial times in regions of electric field, so that beams of positive ions can experience severe space charge effects in the absence of neutralising electrons in such regions. As a result, the ion beam tends to "blow up" and become uncontrollable.

Existing proposals for ion beam scanning contemplate using varying magnetic fields to effect the scanning of the beam. In fact a first region of varying magnetic field provides angular deflection of the ion beam, which then passes into a second region of magnetic field to collimate the deflected beam, so that the beam at the target substrate strikes the substrate at a constant angle as it scans across the substrate. Existing proposals contemplate performing the magnetic scanning and magnetic collimation of the scanned beam after mass selection. A single wafer machine using magnetic beam scanning is disclosed in "Fast Magnetic Scanning and Ion Optical Features of the new IBIS Oxygen Implanter", by Glavish et.al., Ion Implant Technology—92, poublished by Elsevier in 1993.

The above described magnetic beam scanning proposal still occupies substantial space and the scanning magnet may be expensive and require expensive HF power amplifiers. Further, it is believed that electromagnetic scanning of the ion beam may also compromise the space charge neutralisation of the ion beam, especially in the scanning region. This may become especially a problem for relatively low energy ion beams.

There is thus a continuing need for scanning arrangements in ion implanters which can minimise the size of the resulting implanter and also reduce problems of maintaining space charge neutralisation of the ion beam.

SUMMARY OF THE INVENTION

The present invention relates to an ion implanter for implanting ions in a target substrate in which the ion beam is scanned at an extraction point of the ion beam. More specifically, the present invention is an ion implanter for implanting ions in a target substrate and comprising an ion source, an ion beam extraction assembly for extracting ions from the ion source and forming a beam of the extracted ions, a target substrate holder, and an ion mass selector located between the extraction assembly and the substrate holder. The ion mass selector is effective to select ions of a desired mass in said beam of extracted ions for implanting in the target substrate. The extraction assembly is arranged for controllably deflecting the beam of extracted ions over a predetermined maximum deflection angle at least in a deflection plane. The ion mass selector is then operative to select ions of the desired mass in the deflected beam over this maximum deflection angle. A beam of mass selected ions can then be scanned over the target substrate by controlling the deflection angle at the extraction assembly.

With this arrangement, the relatively bulky magnetic scanning magnet can be dispensed with, thereby reducing the size of the implanter. Importantly also, beam deflection is performed electrostatically at the extraction point of the beam from the ion source, where an extraction electric field exists already. As a result, beam deflection is achieved without providing an additional region along the beam path at which space charge neutralisation of the beam can be compromised.

BRIEF DESCRIPTION OF THE DRAWINGS

Examples of the present invention will be described with reference to the accompanying drawings in which.

DETAILED DESCRIPTION

Figure 1:
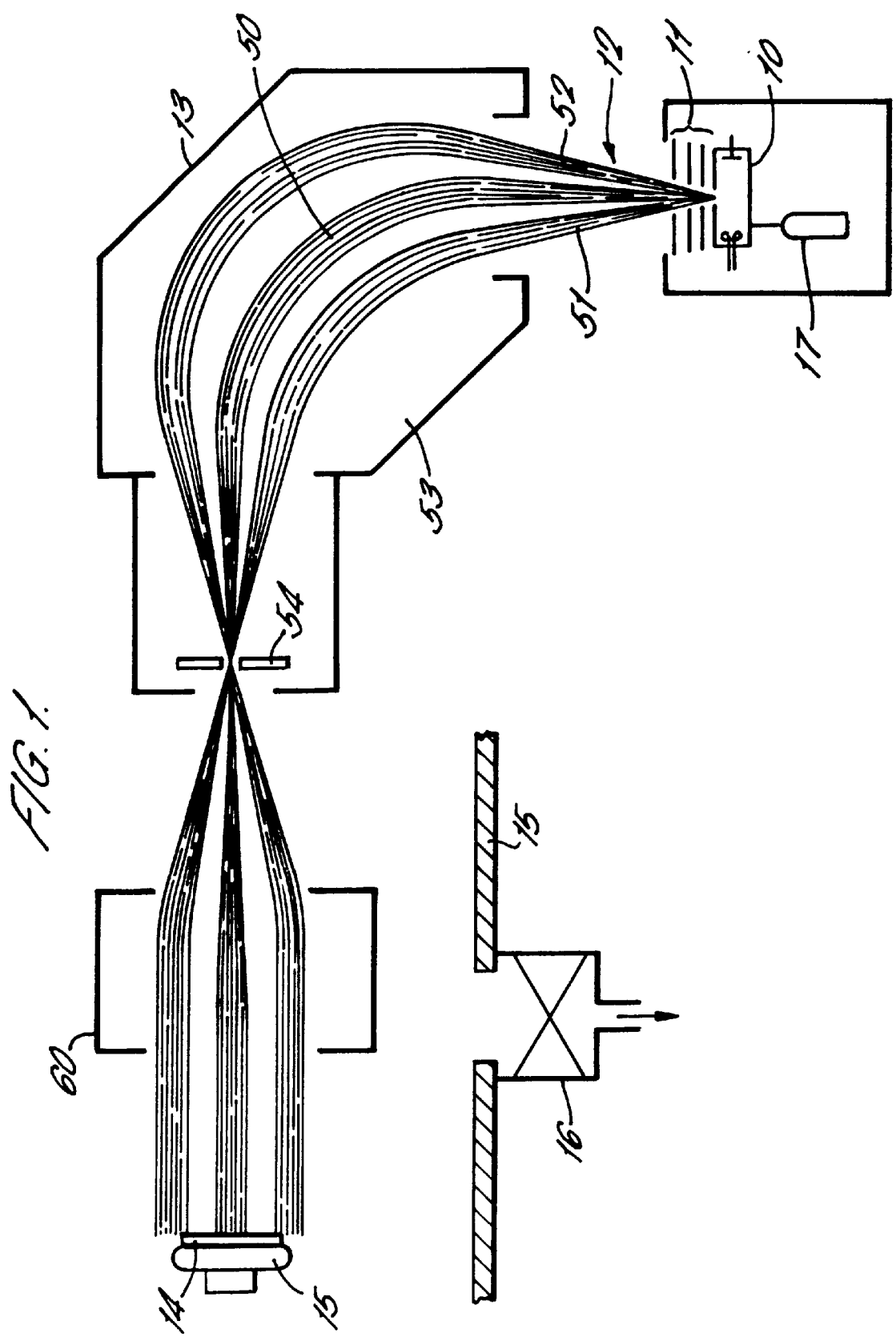
FIG. 1 is a schematic view of an ion implanter embodying the present invention.

Referring to FIG. 1, an ion implanter apparatus embodying the present invention comprises an ion beam source 10 with an extraction assembly 11, directing an ion beam 12 through an ion mass selector 13 to impinge on a target substrate 14 mounted on a target substrate holder 15. As is well known to workers in this field, the above elements of the ion implanter are housed in a vacuum housing of which a part 15 only is illustrated in the Figure. The vacuum housing may be evacuated by a vacuum pump 16.

The ion source 10 may comprise any known ion source such as a Freeman source or a Bernas source. The ion source 10 comprises an arc chamber to which is fed a supply of atoms of or molecules containing the element, ions of which are to be implanted in the target substrate 14. The molecules may be supplied to the arc chamber in gaseous or vapour form, e.g. from a gas bottle 17.

The extraction assembly 11 comprises a number of electrodes located immediately outside a front face of the arc chamber of the ion source 10 so as to extract ions from the arc chamber through an exit aperture in the front face.

Figure 2:
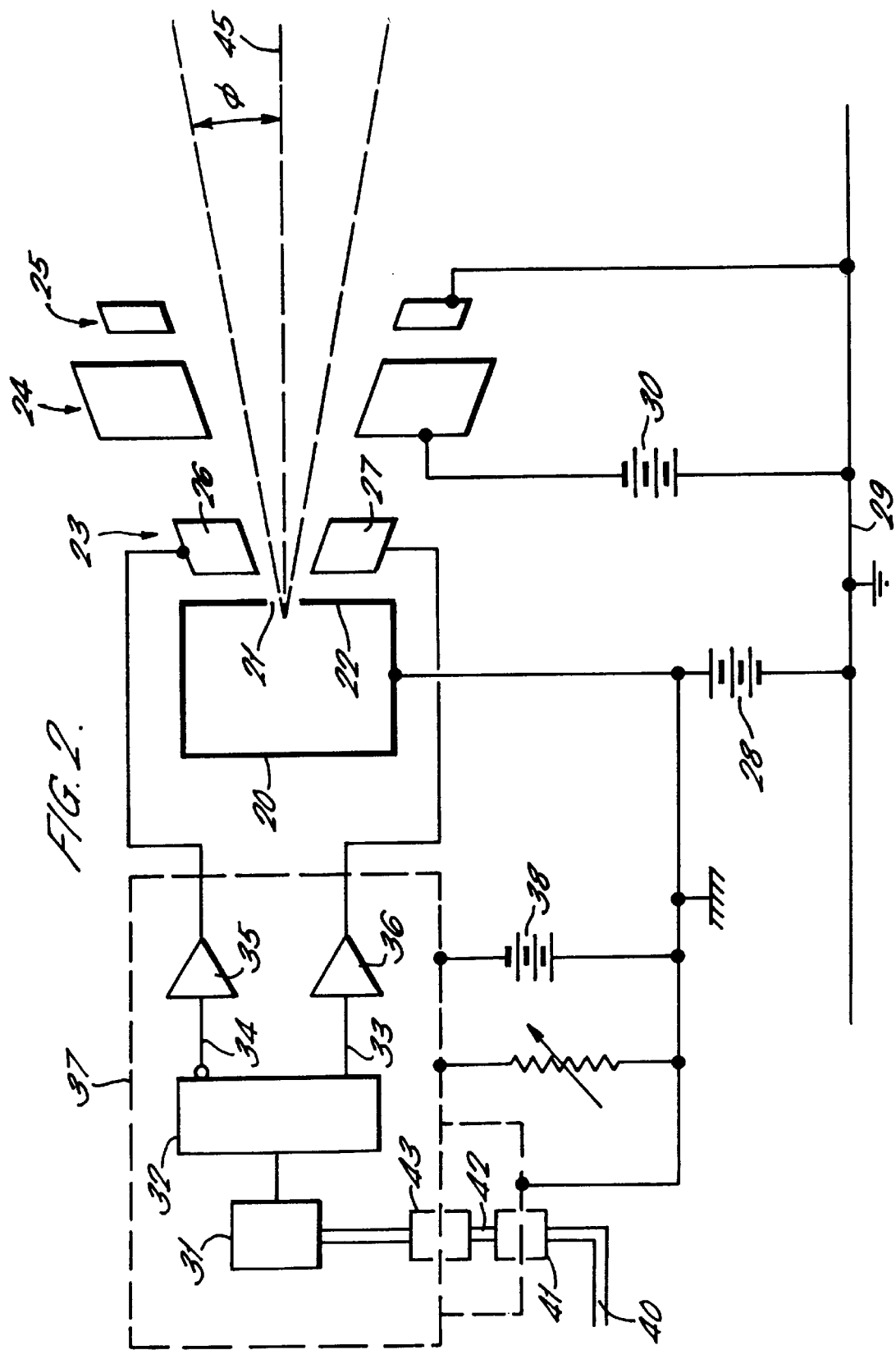
FIG. 2 is a schematic view illustrating the extraction assembly at the ion source of the implanter of FIG. 1, together with the power supplies therefor.

Referring to FIG. 2, the ion source and extraction assembly are illustrated schematically. The arc chamber of the ion source is represented by the box 20 and ions formed in the arc chamber are extracted from the source 20 through an exit aperture 21 in a front face 22 of the source. The front face 22 of the ion source 20 forms a first apertured electrode at the potential of the ion source. The extraction assembly 11 (FIG. 1) is illustrated in FIG. 2 by second, third and fourth apertured electrodes 23, 24 and 25 repsectively. Each of apertured electrodes 24 and 25 comprise a single electrically conductive plate having an aperture through the plate to allow the ion beam emerging from the ion source 20 to pass through. Electrode 23, however, comprises electrically separate, i.e. not electrically connected, upper and lower parts 26 and 27 located on opposite sides of the ion beam emerging from the ion source. For a beam of positive ions, the ion source 20 is maintained by a voltage supply 28 at a positive voltage relative to ground 29. The fourth apertured electrode 25 is a ground electrode which restricts the penetration of the electric fields between the ground electrode 25 and the ion source 20 into the region to the right (in FIG. 2) of the electrode 25. The energy of the ion beam emerging from the extraction assembly is determined by the voltage of the voltage supply unit 28. A typical value for this voltage is 20 kv, providing an extracted beam energy of 20 keV. However extracted beam energies of 80 keV and higher, or 2 keV or lower may also be contemplated.

The third electrode 24 operates as a suppression electrode and is biased by a voltage supply 30 to a negative potential relative to ground 29. The negatively biased suppression electrode 24, operates to prevent electrons in the ion beam downstream of the ground electrode 25 (to the right in FIG. 2) from being drawn into the extraction region and into the ion source. As is known to workers in this field, it is important to minimise the loss of electrons from the ion beam in zero electric field regions, so as to maintain ion beam neutralisation.

The second electrode 23 forms a deflection lens and the electrically separate upper and lower parts 26 and 27 can be held at different voltages to produce a transverse electric field component across the ion beam which can deflect the ion beam emerging from the ion source 20.

The differential voltage supply to the separate components 26 and 27 of the electrode 23 may be derived from a sawtooth voltage generator 31 feeding a differential unit 32 providing phase and antiphase components of the sawtooth waveform on respective outputs 33 and 34. These antiphase components are applied via amplifiers 35 and 36 to respective ones of the components 26 and 27 of the electrode 23. The precise shape of the waveform is selected to provide a desired uniform implant dose over the wafer.

The entire sawtooth voltage supply assembly 37 is held at a negative potential relative to the ion source 21 by a voltage supply unit 38. The output voltage of the supply 38 may typically be 15 kV, although higher and lower voltages are also possible. The value of the power supply 38 is set to optimise the extraction efficiency of ions from the ion source 20. The differential voltage applied between the components 26 and 27 of the electrode 23 may typically have an amplitude considerably less than the value of the output voltage of the power supply 38. Typical differential sawtooth amplitudes on each of the electrode components 26 and 27 are plus or minus 500 volts.

For convenience, the power supply for the sawtooth differential supply 37 is supplied along lines 40 via a first isolator 41 to a power bus 42 on a chassis at the potential of the ion source 20, and then via a second isolator to the sawtooth voltage supply 37 which is at the potential relative to the ion source set by the power supply 38.

The extraction assembly illustrated in FIG. 2, comprising first, second, third and fourth electrodes as mentioned above, is a tetrode structure which has the following advantages. The potential between the arc chamber of the ion source 20 and the second electrode 23, immediately exterior to the exit aperture of the ion source, can be set independently of the potential between the ion source and ground (the shield electrode 25). In this way, the energy of the ion beam emerging from the extraction assembly can be determined independently of the potential at which ions are initially extracted from the arc chamber. This permits the extraction efficiency of the ion source to be optimised and simplifies the "tuning" of the ion source for maximum beam current. Prior art triode extraction assemblies, which dispense with the second electrode 23, require mechanical adjustment of the electrodes to be made in order to optimise or "tune" the ion source for maximum beam current on the target substrate.

Importantly in the arrangement shown in FIG. 2 and embodying the present invention, the second electrode is in two parts allowing a transverse electric field component to be generated between them. As a result, the beam drawn from the arc chamber of the ion source 20 can be steered upwards and downwards, in the plane of FIG. 2, relative to the centre line 45 on the axis of the assembly. Steering angles on either side of the centre line 45 of up to 10° may be achieved.

Referring again to FIG. 1, the effect of steering the beam extracted from the ion source is illustrated. If no differential voltage is applied to the components 26 and 27 of the electrode 23, a central beam 50 is directed along the centre line of the extraction assembly 11 and into the centre of the entrance aperture of the ion mass selector 13. In FIG. 1, beams 51 and 52 are also illustrated representing beams at maximum steering angle on either side of the centre line.

The ion mass selector 13 illustrated in FIG. 1 comprises a magnetic sector mass analyser 53, operating in conjunction with a mass selecting slit 54. The magnetic analyser 53 comprises a region of uniform magnetic field in the direction perpendicular to the plane of the paper in FIG. 1. In such a magnetic field, all ions of constant energy and having the same mass-to-charge ratio will describe circular paths of uniform radius. The radius of curvature of the path is dependent on the mass-to-charge ratio of the ions, assuming uniform energy.

As is well known for such magnetic sector analysers, the geometry of such paths tends to bring a cone of ion paths emanating from an origin focus outside the entrance aperture of the analyser 53, back to a focus beyond the exit aperture of the analyers. As illustrated in FIG. 1, the origin focus or point of origin of the central beam 50 is a point close to, typically just inside, the exit aperture of the arc chamber of the ion source 10. The beam 50 is brought to a focus in the plane of the mass selection slit 54 beyond the exit aperture of the analyser.

In FIG. 1, the beam 50 is drawn showing only ions of a single mass/charge ratio, so that the beam comes to a single focus at the aperture of the slit 54, so that the beam of ions of this mass/charge ratio can pass through the slit 54 towards the target substrate 14. In practice, the beam emitted by the ion source 10 will also contain ions of different mass/charge ratio from those desired for implantation in the substrate 14 and these undesired ions will be brought to a focus by the analyser 53 at a point in the plane of the slit 54 either side of the position of the slit, and will therefore be prevented from travelling on towards the substrate. The analyser 53 thus has a dispersion plane in the plane of the drawing.

The described embodiment of the present invention exploits the above property of the magnetic sector analyser 53 to accommodate and mass select not only an ion beam 50 along the centre line, but also beams 51 and 52 deflected by the steering arrangement of the extraction assembly 11 to each side of the centre line in the dispersion plane of the analyser. Because of the properties of the magnetic sector analyser, these beams 51 and 52 also may be brought to a focus at the mass selection slit 54, so that only ions of desired mass/charge ratio in the deflected beams pass through the mass selection slit.

In this way, the effect of repeatedly deflecting the ion beam at the extraction assembly 11, by applying the sawtooth waveform described with reference to FIG. 2 to the two components 26 and 27 of the second electrode 23, is to provide, emerging from the mass selection slit 54, a beam of ions of desired mass which is correspondingly scanned angularly by a predetermined amount on either side of the centre line.

In FIG. 1, this angularly scanned beam is passed through a magnetic collimator 60 which has the effect of parallelising the scanned beam, so that the angle of implant of ions from the beam into the substrate 14 on the substrate holder 15 is constant over the range of scanning.

As shown in FIG. 1, the angle of deflection of the ion beam produced by the extraction assembly 11, is determined in combination with the geometry of the ion beam path, so that the ion beam at the substrate 14 is scanned in the plane of the paper in FIG. 1 by an amount sufficient so as fully to cover the width of the substrate 14. In order to achieve a complete overall scan of the substrate 14, the substrate holder 15 may be reciprocated in a direction orthogonal to the direction of scanning of the ion beam, i.e. in and out of the plane of the paper in FIG. 1.

As can be seen from the arrangement illustrated in FIG. 1, by angularly steering the ion beam at the extraction assembly 11, there is no requirement for any additional beam deflection arrangement which would, in prior art arrangements, be located between the mass selection slit 54 and the collimator magnet 60. As a result, the loss of space charge neutralisation which may occur in the magnetic scanning arrangement is avoided. Importantly also, the overall length of the beam between the ion source 10 and the substrate 14 can be reduced. Especially for relatively low energy beams, it is generally desirable to keep the length of the beam as short as possible to minimise beam expansion due to inadequate beam neutralisation at such low energies. Also, the size of the ion implanter as a whole can be reduced and the footprint of the machine on the process room floor can be similarly reduced.

A further advantage is that the collimator magnet 60 may be located with its focal point at the mass selection slit 54, so that both the angular deflection of the ion beam and the divergeance of ions in the beam can be parallelised optimally.

Referring again to FIG. 1, it will be understood that the diagrammatic illustration in this Figure does not show the various insulations between the different components of the ion implanter. These have been left out for clarity but the skilled worker in this field will be familiar with the electrical insulation requirements of the system.

Figure 3:
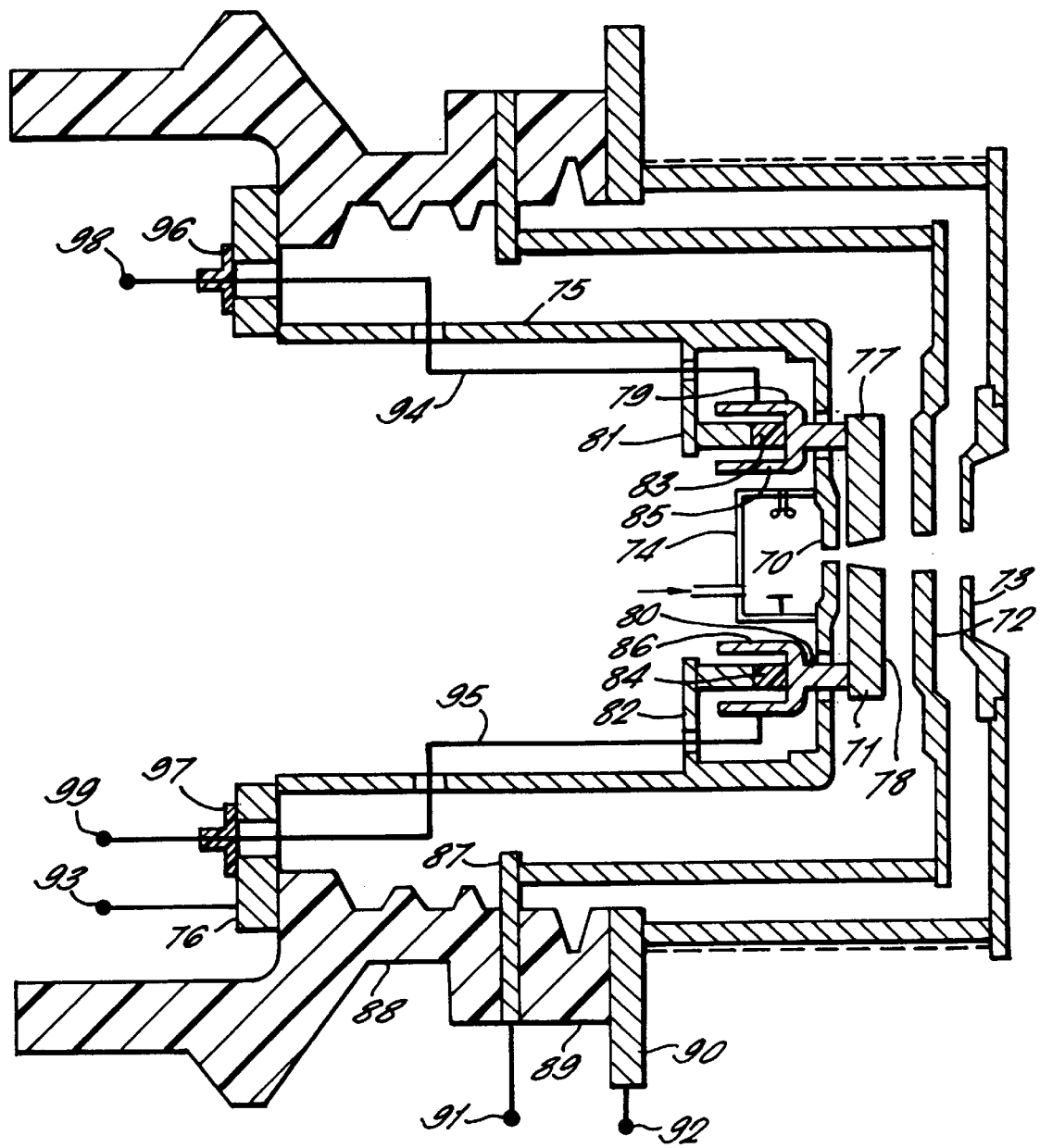
FIG. 3 is a cross-sectional view of the mechanical construction of a preferred embodiment of the extraction assembly, by way of example only.

FIG. 3 illustrates a particular structure of ion source and extraction assembly which may be used in an embodiment of the present invention.

In FIG. 3, the first, second, third and fourth electrodes forming the front face of the arc chamber of the ion source and the extraction assembly, are shown at 70, 71, 72 and 73 respectively. The arc chamber of the ion source is illustrated schematically at 74 in reduced size for clarity.

The front face of the arc chamber forming the first electrode 70 is mounted on a conducting cylinder 75, which is in turn mounted on a conducting flange 76. The second electrode 71 has upper and lower parts 77 and 78 which are respectively mounted by pins 79 and 80 on internal flange elements 81 and 82 of the conducting cylinder 75. The mounting pins 79 and 80 include insulating segments 83 and 84 within screening bells 85 and 86, so that the parts 77 and 78 are insulated from the cylinder 75 and the front face 70 of the arc chamber 74. However, the pins 79 effectively mount the parts 77 and 78 of the second electrode 71 securely in a predetermined spaced relation with respect to the front face 70 forming the first electrode.

The third electrode 72 is mounted on a conducting flange 87 which is sandwiched between insulating collars 88 and 89. The fourth electrode 73, the shield electrode, is in turn mounted on a further conducting flange 90 which is insulated from the conducting flange 87 by the insulating collar 89.

Connections to the third and fourth electrodes 72 and 73 may be made via the conducting flanges 87 and 90 at terminals 91 and 92 respectively. Connection to the ion source 74 and the front face 70 forming the first electrode may be made via the flange 76 at a terminal 93. Connections 94 and 95 to the parts 77 and 78 of the second electrode 71 are fed out through insulating feedthroughs 96 and 97 to respective terminals 98 and 99.

As shown in FIG. 3, each of electrodes 70, 71, 72 and 73 includes an aperture through which a beam of ions can pass. To accommodate the steering of the beam provided by a differential voltage on the parts 77 and 78 of the electrode 71, the apertures in the electrodes become progressively wider towards the outermost electrode 73.

The precise dimensions of the various components of the apparatus as described above can be determined empirically or will be known to those skilled in this art. It will be understood that many variations of the details given above are possible within the scope of the present invention. The arrangements described above are by way of illustration only.

What is claimed is:

1. An ion implanter for implanting ions in a target substrate, comprising an ion source, an ion beam extraction assembly for extracting ions from the ion source and forming a beam of the extracted ions, a target substrate holder, and an ion mass selector between said extraction assembly and said substrate holder for selecting ions of a desired mass in said beam of extracted ions for implanting in said target substrate, said extraction assembly being arranged for controllably deflecting said beam of extracted ions over a predetermined maximum deflection angle, at least in a deflection plane, said ion mass selector being operative to select ions of said desired mass in the deflected beam over said maximum deflection angle, whereby a beam of mass selected ions can be scanned over said target substrate by controlling the deflection angle at the extraction assembly.

2. The ion implanter of claim 1, wherein said ion mass selector comprises an analysing magnet providing an analysing region having a predetermined dispersion plane in which ions of differing mass/charge ratios are spatially dispersed by the field of the analysing magnet, and said extraction assembly is arranged so that the ion beam entering the analysing region is deflected in said dispersion plane.

3. The ion implanter of claim 2, wherein the extraction assembly is arranged in association with the ion source such that the extracted beam entering the analysing region has a focal point of origin which is fixed as the beam is deflected.

4. The ion implanter of claim 1, wherein said ion source comprises an arc chamber in which ions are formed, said arc chamber having a front face with an exit aperture through which ions can be extracted from the arc chamber, and said extraction assembly comprises an electrostatic deflection lens having electrodes located externally of said exit aperture to be on opposite sides of an ion beam emerging from said exit aperture, a first voltage supply connected to apply an extraction potential difference between the arc chamber front face and the electrodes of the deflection lens in common, and a second voltage supply connected to apply a deflection potential difference between electrodes of said lens.

5. The ion implanter of claim 4, wherein said extraction assembly further comprises a shield electrode at the potential of the ion mass selector located between the ion mass selector and said deflection lens, a suppression electrode between said shield electrode and said deflection lens, a third voltage supply connected to bias the arc chamber relative to said shield electrode at a potential corresponding to the desired energy of the ion beam supplied to the ion mass selector, and a fourth voltage supply connected to maintain said suppression electrode at a negative potential relative to said shield electrode.

6. An electrode assembly for extracting ions from an arc chamber and forming a steerable beam of the extracted ions, the electrode assembly comprising a first apertured electrode adapted to form a front face of the arc chamber and forming an exit aperture through which ions can be extracted from the arc chamber, a second apertured electrode adjacent the first electrode and having electrically separate components forming opposite sides of the aperture of said second electrode to form an electrostatic deflection lens, a third apertured electrode adjacent said second electrode and a fourth apertured electrode adjacent said third electrode, said first, second, third and fourth electrodes being electrically insulated from one another.

7. The electrode assembly of claim 6 in combination with a first voltage supply connected to apply an extraction potential difference between said first electrode and the components of said second electrode in common, a second voltage supply connected to apply a deflection potential difference between the components of said second electrode, a third voltage supply connected to bias said first electrode relative to said fourth electrode at a potential corresponding to the desired energy of the ion beam from the electrode assembly, and a fourth voltage supply connected to maintain said third electrode at a negative potential relative to said fourth electrode.

8. A method of scanning an ion beam across a target substrate in an ion implanter comprising an ion source, an ion beam extraction assembly for extracting ions from the ion source and forming a beam of the extracted ions at a predetermined energy, a holder for the target substrate, and an ion mass selector between said extraction assembly and said substrate holder for selecting ions of a desired mass in said beam of extracted ions for implanting in said target substrate, the method comprising electrostatically deflecting the ions in the extraction assembly transversely of the beam direction at a position where the ions experience an accelerating or decelerating field in the beam direction, thereby angularly steering the direction of said beam, passing the steered beam through the ion mass selector to provide a steered beam of mass selected ions, and changing the angle of said beam of extracted ions to scan the beam of mass selected ions across the target substrate.

* * * * *